United States Patent
Egelhoff, Jr. et al.

(10) Patent No.: US 6,354,437 B1
(45) Date of Patent: Mar. 12, 2002

(54) CARRIER FOR RESISTORS

(75) Inventors: Byron D. Egelhoff, Jr., Mesa, AZ (US); Risto Trendov, Reondo Beach, CA (US); Gerald J. Bransford, deceased, late of Iomita, CA (US), by Gerald Bransford, Jr., executor

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/502,061

(22) Filed: Feb. 10, 2000

(Under 37 CFR 1.47)

(51) Int. Cl.[7] ............................................. B65D 85/30
(52) U.S. Cl. ...................................... 206/726; 206/728
(58) Field of Search ................................ 206/724, 726, 206/728, 722, 565

(56) References Cited

U.S. PATENT DOCUMENTS

| | | | |
|---|---|---|---|
| 3,417,865 A | * | 12/1968 | Suverkropp et al. |
| 3,892,312 A | * | 7/1975 | Tems |
| 4,379,505 A | * | 4/1983 | Alemanni |
| 4,556,145 A | * | 12/1985 | Putnam |
| 4,866,837 A | | 9/1989 | Heissenberger et al. ...... 29/741 |
| 4,991,714 A | * | 2/1991 | Clatanoff |

* cited by examiner

Primary Examiner—David T. Fidei
(74) Attorney, Agent, or Firm—John Tarlano

(57) ABSTRACT

A combination of a carrier and cylindrical resistors, the carrier having a base that has a plurality of holding regions, two parallel rails for supporting a resistor in each holding region, each parallel rail having a non-ramped bottom surface, a ramped side surface and an arced surface between the non-ramped bottom surface and the ramped side surface, the two parallel rails being inward of two flexible tangs in each holding region, each of the two flexible tangs having an arm positioned for pushing on each of two wire conductors of each cylindrical resistor, to cause a body of each cylindrical resistor to be pushed against the arched surfaces of the parallel rails.

3 Claims, 2 Drawing Sheets

CARRIER FOR RESISTORS

BACKGROUND OF THE INVENTION

The disclosed carrier has a holding region for removably holding a resistor. The disclosed carrier has a multiple number of holding regions for removably holding a multiple number, that is a plurality, of resistors. Several holding regions can be formed in a straight line in the carrier. Another holding region can be formed in the disclosed carrier in a position that is parallel to the holding regions that are in a straight line.

The disclosed carrier will retain one resistor at each holding region. The holding regions of the carrier can be made to have varying lengths. The carrier can thus retain resistors of varying lengths. A holding region would have a length that is larger that the length of its associated resistor.

The disclosed carrier would allow a resistor to be grabbed around its body, thus allowing for removal of the resistor from the carrier. A central opening passes through the bottom of the base of the carrier at a holding region. The central opening is below a resistor. The central opening allows the automatic equipment to grab around the resistor. The automatic equipment can then place the removed resistor into a circuit board.

The carrier has a rail positioned to either side of a central opening at the bottom othe base of the carrier. This pair of rails supports a resistor at the holding region. Each rail has a first upper surface, the first upper surface being ramped, and an adjacent second upper surface, the second upper surface being in the plane of the carrier. The junction of the first and second upper surfaces of a rail forms an arced surface. Each of the two arced surfaces engages an end of the resistor. The pair of arced surfaces that are formed by the pair of rails, engage ends of a cylindrical body of a resistor prior to the resistor being pushed out of the carrier. The ramped surfaces of the rails allow the ends of a resistor to slide on the rails as the resistor is being pulled out of the carrier.

The disclosed carrier is composed of a flexible plastic material. At a holding region of the disclosed carrier are two flexible L-shaped tangs. The tangs are composed of the flexible plastic material that makes up the rest of the carrier. The tangs are thus integral with the rest of the plastic carrier. The tangs are located to the outsides of a pair of rails. A tang has an end portion that is parallel to a ramped surface of a rail. The tangs flex to push on the conductors of a resistor, to thus push the body of the resistor against the arced surfaces of the rails.

SUMMARY OF THE INVENTION

A carrier for holding a resistor at a holding region comprising a base, rail means within the base at the holding region, for supporting a body of a resistor across a central opening in the base, the central opening being under the resistor, and flexible tang means within the base at the holding region, for pushing ends of the body of the resistor against the rail means.

DESCRIPTION OF THE PREFERRED EMBODIMENT

Figure 1:
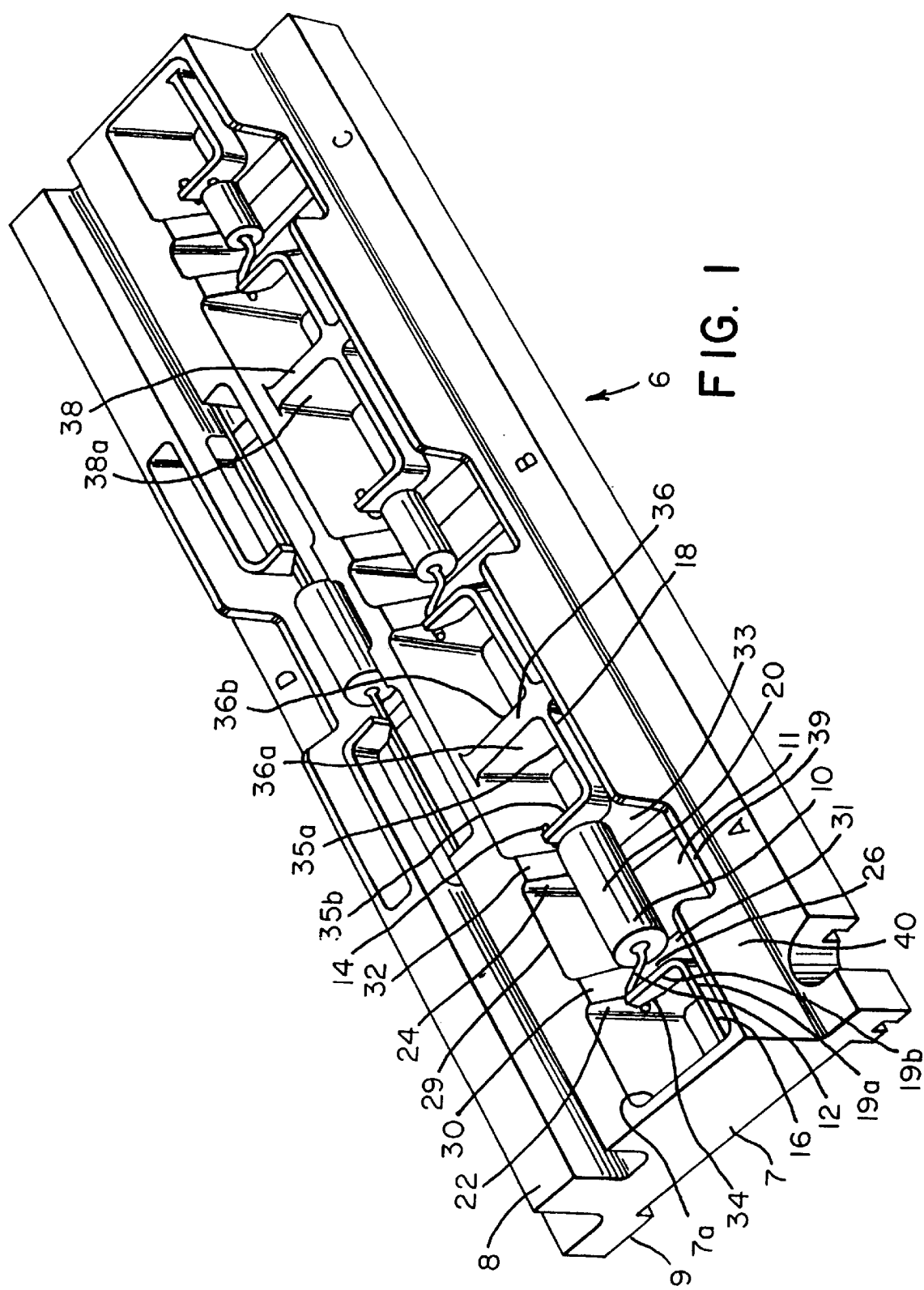
FIG. 1 is a perspective view of a carrier for holding a multiple number of resistors, one holding region A of the unitary carrier holding a resistor having wire conductors that are bent.

FIG. 1 shows a carrier 6. The carrier 6 can be molded, such as molded from a moldable plastic material or other moldable material. Such a moldable plastic material can be polyethylene plastic.

The carrier 6 has a base 7. The base 7 has an upper plane 8 and a lower plane 9. The carrier 6 holds a resistor 10, having bent wire conductors 12 and 14, at holding region A. Region A is defined by a walled cavity in base 7. The carrier 6 also has holding regions B, C and D.

Resistors that are progressively shorter than resistor 10 are held in carrier 6 at holding regions A, B and C. The resistors held at holding regions B and C have bent conductors. A resistor held at holding region D of carrier 6 has straight conductors.

An central opening 11 is formed in the bottom of the cavity that is in the base 7 at holding region A of carrier 6. The central opening 11 is at the center of holding region A. The opening 11 is below the central part of resistor 10. Easy access around resistor 10 can be obtained due to the central opening 11. The resistor 10 can be pulled out of holding region A.

Flexible L-shaped plastic tangs 16 and 18 are formed as integral portions of carrier 6 at holding region A. The tang 16 has a leg 19a and an arm 19b. An end of the leg 19a, that is away from arm 19b, is connected to inner surface 7a of the base 7 of the carrier 6.

The flexible tangs 16 and 18 press on the end portions of the wire conductors 12 and 14 to press the ends of a body 20 of resistor 10 against rails 22 and 24 of carrier 6. The resistor 10 rests on the rails 22 and 24 and can ride upward on the rails 22 and 24. The rails 22 and 24 are integral portions of the carrier 6 at holding region A. The rails 22 and 24 and tangs 16 and 18 are formed as portions of the carrier 6.

The carrier 6 is made from a flexible plastic material such that the L-shaped tangs 16 and 18, being formed from such material, are flexible. The leg of each of tang 16 and 18, such as leg 19a of tang 16, will bend away from conductor 12 of resistor 10 as resistor 10 is pushed away from holding region A.

The body 20 of the resistor 10 rides in arced surfaces 26 and 28 of rails 22 and 24. Rails 22 and 24 are portions of the bottom and inner central wall 29 of the cavity in base 7 at holding region A. These arced surfaces 26 and 28 are created by the junction of surfaces 30 and 31 of rail 22 and the junction of surfaces 32 and 33 of rail 24, respectively. Surfaces 30 and 32 are ramped surfaces, with respect to the upper plane 8 of base 7 of carrier 6. Surfaces 31 and 33 are non-ramped and are parallel to the upper plane 8 of base 7 of carrier 6. The arced surface 26 is made as a result of an obtuse angle formed by the junction of the ramped surface 30 of rail 22 and the non-ramped surface 31 of the rail 22. The arced surface 28 is made as a result of an obtuse angle formed by junction of the ramped surface 32 of rail 24 and the non-ramped surface 33 of the rail 24. There is an opening to either side of the combination of rail 22, central opening 11 and rail 24, these other openings being in the bottom of the cavity that defines holding region A.

The arm 19b of tang 16 has a beveled end 34. The beveled end 34 is parallel to the ramped surface 30 of rail 22. The beveled end 34 is located close to the ramped surface 30 since the conductor 12 of the resistor 10 is bent toward the ramped surface 30. The tang 16 will thus press against the end of bent conductor 12. The rail 22 retains an end of resistor 10 in arc 26, as the end 34 of arm 19b of tang 16 pushes on the end of bent conductor 12.

The arm 35b of L-shaped tang 18 has a beveled end. This beveled end is parallel to the ramped surface 32 of rail 24. This beveled end is also close to the ramped surface 32 so that the beveled end of arm 35b of tang 18 will press against the end of bent conductor 14. The rail 24 retains an end of resistor 10 in arc 28, as the beveled end of arm 35b of tang 18 pushes on the end of bent conductor 14.

Again, the tang 18 has a leg 35a. The leg 35a is connected to a divider 36 in base 7. Divider 36 separates holding region A from holding region B. The holding region A is defined by a walled cavity in base 7 between the inner surface 7a of base 7 and the surface 36a of divider 36, and between wall 40 and an opposite wall 29 to wall 40. The holding region B is defined by a cavity in base 7 ween the surface 36b of divider 36 and the surface 38a of divider 38, and between wall 40 and an opposite wall 29 to wall 40. Holding regions C and D are also defined by similar cavities in base 7.

A wall 40 of base 7 is shortened at wall portion 39 in front of resistor 10 to allow automatic equipment easy access to resistor 10, to thus allow the automatic equipment to more readily grab onto resistor 10. The resistor 10 can be transported away from carrier 6 by the automatic equipment. The wall 40 is also shortened in front of the resistors in holding regions B and C.

FIG. 1 shows rail 22 for holding one end of the resistor 10. Rail 22 cooperates with tang 16 to hold one end of the resistor 10 against arced surface 26. FIG. 1 also shows rail 24 for holding the other end of the resistor 10. Rail 24 cooperates with tang 18 to hold the other end of the resistor 10 against arced surface 28.

Resistor 10 can travel upward, sliding on the ramped surfaces 30 and 32 of rails 22 and 24, as the resistor 10 is being pulled out of holding region A.

Figure 2:
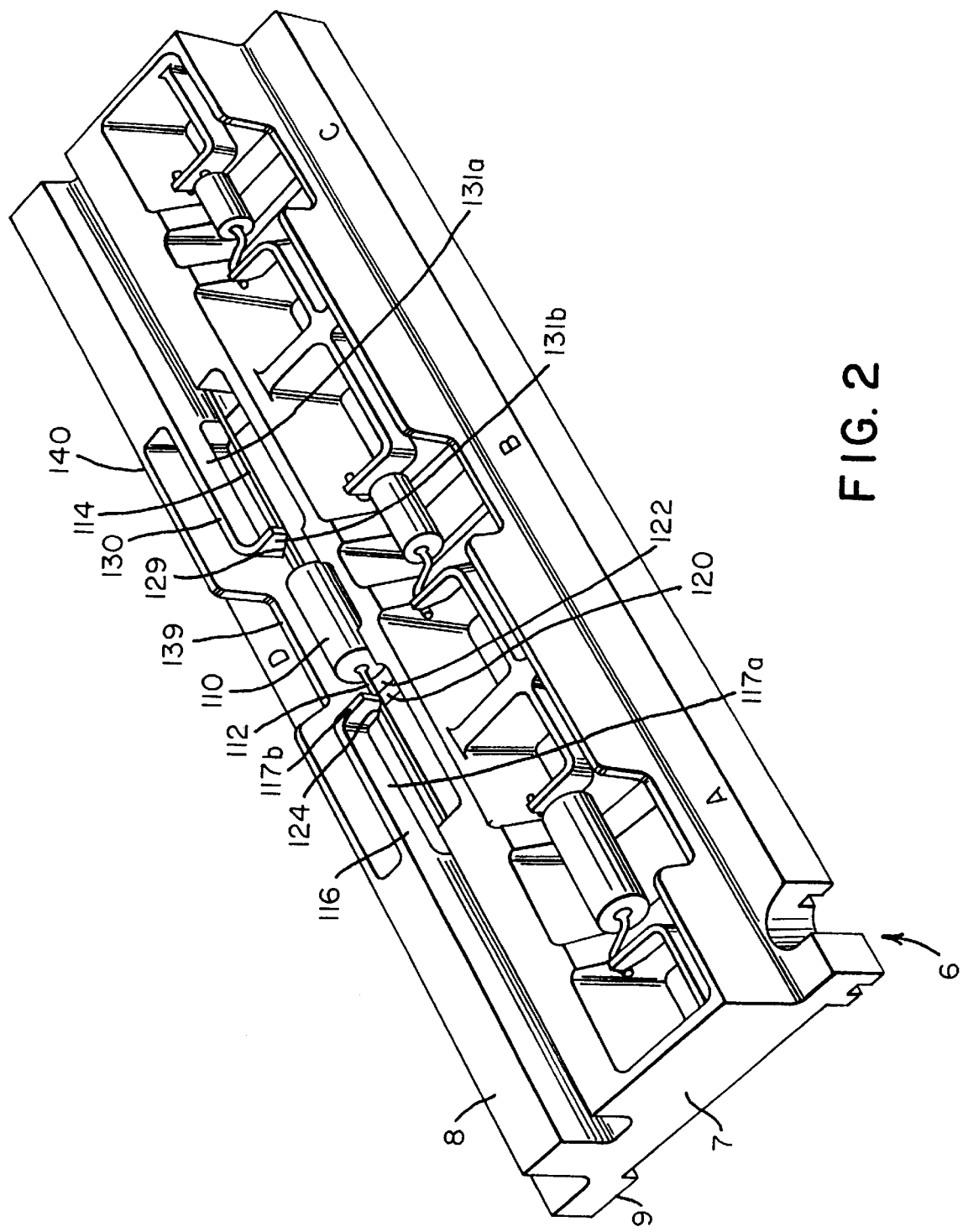
FIG. 2 is a perspective view of a carrier for holding a multiple number of resistors, another holding region D of the unitary carrier holding a resistor having wire conductors that are straight.

FIG. 2 shows a resistor 110 being held in a holding region D of carrier 6. The resistor 110 has straight wire conductors 112 and 114.

An L-shaped tang 116 is shown as a portion of carrier 6. The tang 116 has a leg portion 117a and an arm portion 117b. The tang 116 pushes on the straight conductor 112 of resistor 110.

A central opening is below resistor 110 within the cavity of base 7 that defines holding region D. The central opening is used to allow automatic equipment to pull resistor 110 out of the holding region D of carrier 6.

A rail 120 is also shown as a portion of holder portion D of carrier 6. The tang 116 pushes the resistor 110 against rail 120, since the tang 116 pushes on the straight conductor 112 of resistor 110. Rail 120 has a ramped surface. Rail 120 has a non-ramped surface 122 that is parallel to the upper plane 8 of base 7. These two surfaces meet to form an arced surface of rail 120. There is an opening, in the bottom of the cavity that defines holding region D, to either side of the combination of the rail 120, the central opening under resistor 110, and a rail adjacent to rail 120.

A beveled end 124 of arm 117b of the tang 116 is shown as coming in contact with conductor 112.

A rail supports another end of resistor 110 in the holding region D of carrier 6. It is again noted that this resistor 110 has straight conductors.

The beveled end 124 of arm 117b of tang 116 is located further from a ramped surface of rail 120 than the beveled end 34 of tang 16 is from ramped surface 30, as shown in FIG. 1, since the conductor 112 is straight while the conductor 12 is bent. The tang 116 pushes an end of resistor against the arced surface of rail 120.

A beveled end 129 of an L-shaped tang 130 pushes another end of resistor 110 against a rail of holder portion D, since the beveled end 129 pushes on the straight conductor 114 of resistor 110. L-shaped tang 130 has a leg 131a and an arm 131b. Thus the tang 130 holds this other end of the resistor 110 against an arced surface of this other rail.

A wall 140 of base 7 is shortened at wall portion 139 in front of resistor 110 to allow automatic equipment easy access to resistor 110, to thus allow the automatic equipment to more readily grab onto resistor 110. The resistor 110 can be transported away from carrier 6 by the automatic equipment.

While the present invention has been disclosed in connection with the preferred embodiment thereof, it should be understood that there may be other embodiments which fall within the spirit and scope of the invention defined by the following claims.

What is claimed is:

1. A carrier for holding a resistor in a holding region, the combination comprising:
   (a) the resistor in the holding region, the resistor having a cylindrical body, the cylindrical body having two ends, a wire conductor extending from each end of the cylindrical body of the resistor; and
   (b) the carrier, the carrier comprising:
      (a') a base having the holding region;
      (b') parallel rail means within the base at the holding region, for supporting the cylindrical body of the resistor across a central opening in the base, the central opening being under the resistor; and
      (c') flexible tang means within the base at the holding region, the flexible tang means having arms that are parallel to the rail means, the arms of the flexible tang means positioned for pushing on a side of each of the wire conductors of the resistor, to cause a side of the cylindrical body of the resistor, at each end of the cylindrical body of the resistor, to be pushed against the rail means.

2. A carrier for holding a resistor in each of a plurality of holding regions, the combination comprising:
   (a) the resistor in each of the plurality of holding regions, each resistor having a cylindrical body, the cylindrical body of each resistor having two ends, a wire conductor extending from each end of the cylindrical body of each resistor; and
   (b) the carrier, the carrier comprising:
      (a') a base having the plurality of holding regions;
      (b') two parallel rails within the base at each of the plurality of holding regions, each rail for supporting an end of a cylindrical body of a resistor, a central opening extending between said rails, each rail having a non-ramped bottom surface, a ramped side surface, a junction of the non-ramped bottom surface and the ramped side surface of each rail forming an arced surface; and
      (c') two flexible tangs within the base at each of the plurality of holding regions, each of the two flexible tangs in a holding region having an arm positioned for pushing on a side of a wire conductor of a resistor in the holding region, to cause each end of the cylindrical body of a resistor to be pushed against an arced surface of one of the two rails in the holding region, each tang having an end that is in parallel arrangement with the ramped surface of each rail in the holding region, each tang being outward of the rails in the holding region, said tangs being displaced from the surfaces of the rails.

3. A carrier for holding a resistor in each of a plurality of holding regions, the combination comprising:
   (a) the resistor in each of the plurality of holding regions, each resistor having a cylindrical body, the cylindrical body of each resistor having two ends, a wire conductor extending from each end of the cylindrical body of each resistor; and
   (b) the carrier, the carrier comprising:
      (a') a base having a plurality of holding regions;
      (b') two parallel rails within the base at each of the plurality of holding regions, each rail for supporting an end of a cylindrical body of a resistor, a central opening extending between said rails, each said rail having a non-ramped bottom surface, that is parallel to an upper plane of the base, each rail having a ramped side surface, the ramped side surface ramped upward with respect to the non-ramped bottom surface, a junction of the non-ramped bottom surface and the ramped side surface of each rail forming an arced surface; and
      (c') two flexible tangs within the cylindrical base at each of the plurality of holding positions, each tang having an arm positioned for pushing on a side of a wire conductor of a resistor, to cause an end of a cylindrical body of a resistor to push against an arced surface of a rail, each tang having a beveled end that is in parallel arrangement with a ramped side surface of a rail, an arm of each tang being outward from said rails and parallel to non-ramped bottom surface of a rail, said tangs being displaced from the surfaces of the rails.

* * * * *